(12) United States Patent  (10) Patent No.: US 7,674,125 B2
Chien et al.  (45) Date of Patent: Mar. 9, 2010

(54) SOCKET CONNECTOR HAVING CONTACT TERMINALS WITH RELIABLE AND DURABLE INTERCONNECTION WITH PIN LEGS OF A CPU

(75) Inventors: Cheng-Ching Chien, Tu-Cheng (TW);
Chih-Pi Cheng, Tu-Cheng (TW);
Liang-Kai Lee, Tu-Cheng (TW);
Nan-Hung Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/485,078

(22) Filed: Jun. 16, 2009

(65) Prior Publication Data

US 2009/0311889 A1  Dec. 17, 2009

(30) Foreign Application Priority Data

Jun. 16, 2008  (TW) .................................. 97122365

(51) Int. Cl.
*H01R 4/50*  (2006.01)
(52) U.S. Cl. ..................................................... 439/342
(58) Field of Classification Search ................. 439/342, 439/857
See application file for complete search history.

(56) References Cited

U.S. PATENT DOCUMENTS 6,319,038 B1 * 11/2001 Howell et al. ............... 439/342
7,361,044 B1 * 4/2008 Pandey et al. ............... 439/342

FOREIGN PATENT DOCUMENTS

CN  2766365  3/2006

* cited by examiner

*Primary Examiner*—Phuong K Dinh
(74) *Attorney, Agent, or Firm*—Wei Te Chung; Andrew C. Cheng; Ming Chieh Chang

(57) ABSTRACT

An electrical connector for electrically connecting a pin leg of a CPU with a trace of a PCB includes an insulative housing (3) and a contact (1). The contact includes a base (10) and a pair of arm sections (20) oppositely extending from lateral sides of the base for engagement with the pin leg. The base has a body section (12) for being secured in the insulative housing and a soldering section (14) for being soldered onto the PCB. Each arm section forms a heave (24) to interfere with the insulative housing because of deformation of the arm sections.

1 Claim, 3 Drawing Sheets

SOCKET CONNECTOR HAVING CONTACT TERMINALS WITH RELIABLE AND DURABLE INTERCONNECTION WITH PIN LEGS OF A CPU

BACKGROUND OF THE INVENTION

1. Field of the Invention

The present invention relates generally to a socket connector, and more particularly to a socket connector having contact terminals with reliable and durable interconnection with pin legs of a CPU.

2. Description of Related Arts

An electrical connector comprises an insulative base, a contact received in the insulative base and a pin leg of a CPU electrically connecting with the contact. The contact comprises a base portion and a pair of spring portions laterally extending from the base portion for sandwiching the pin leg of the CPU and achieving electrical connection therebetween. However, a maintenance force for the pin leg depends on flexibility of the spring portions, and because of a long extension of the spring portions, the maintenance for the pin leg of the CPU is not so enough that the electrical connection between the pin leg of the CPU and the contact is greatly influenced.

Hence, an improved electrical connector with improved contact providing more reliable maintenance force for the pin leg of the CPU is desired.

SUMMARY OF THE INVENTION

Accordingly, an object of the present invention is to provide an electrical connector with improved contact providing more reliable maintenance force for a pin leg of a CPU.

To achieve the above object, an electrical connector for electrically connecting a pin leg of a CPU with a trace of a PCB includes an insulative housing and a contact. The contact includes a base and a pair of arm sections oppositely extending from lateral sides of the base for engagement with the pin leg. The base has a body section for being secured in the insulative housing and a soldering section for being soldered onto the PCB. Each arm section forms a heave to interfere with the insulative housing because of deformation of the arm sections.

Other objects, advantages and novel features of the invention will become more apparent from the following detailed description when taken in conjunction with the accompanying drawings.

DETAILED DESCRIPTION OF THE PREFERRED EMBODIMENT

Figure 1:
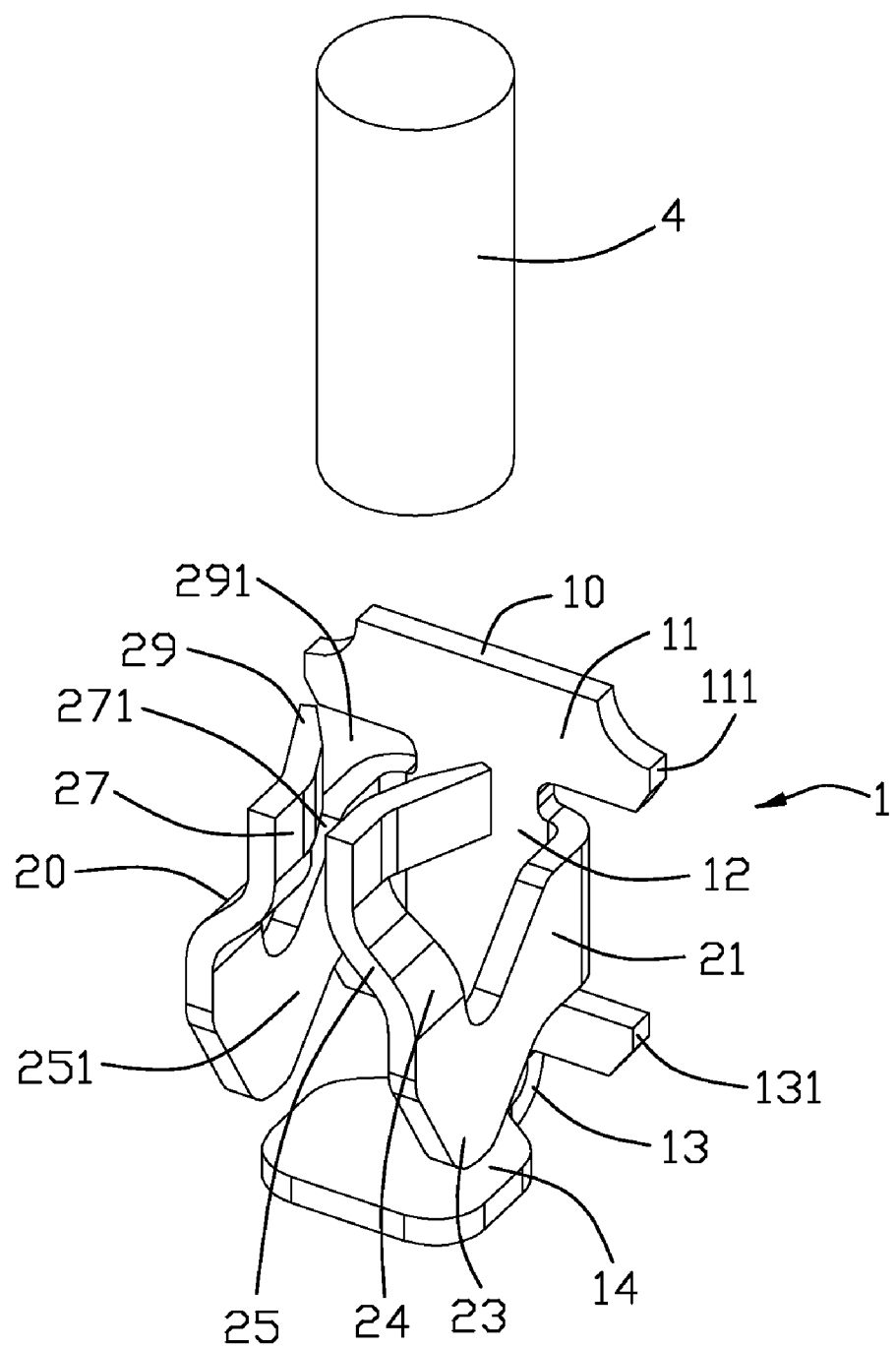
FIG. 1 is a perspective view of an electrical contact and a pre-inserted pin leg of a CPU according to the present invention.
Figure 2:
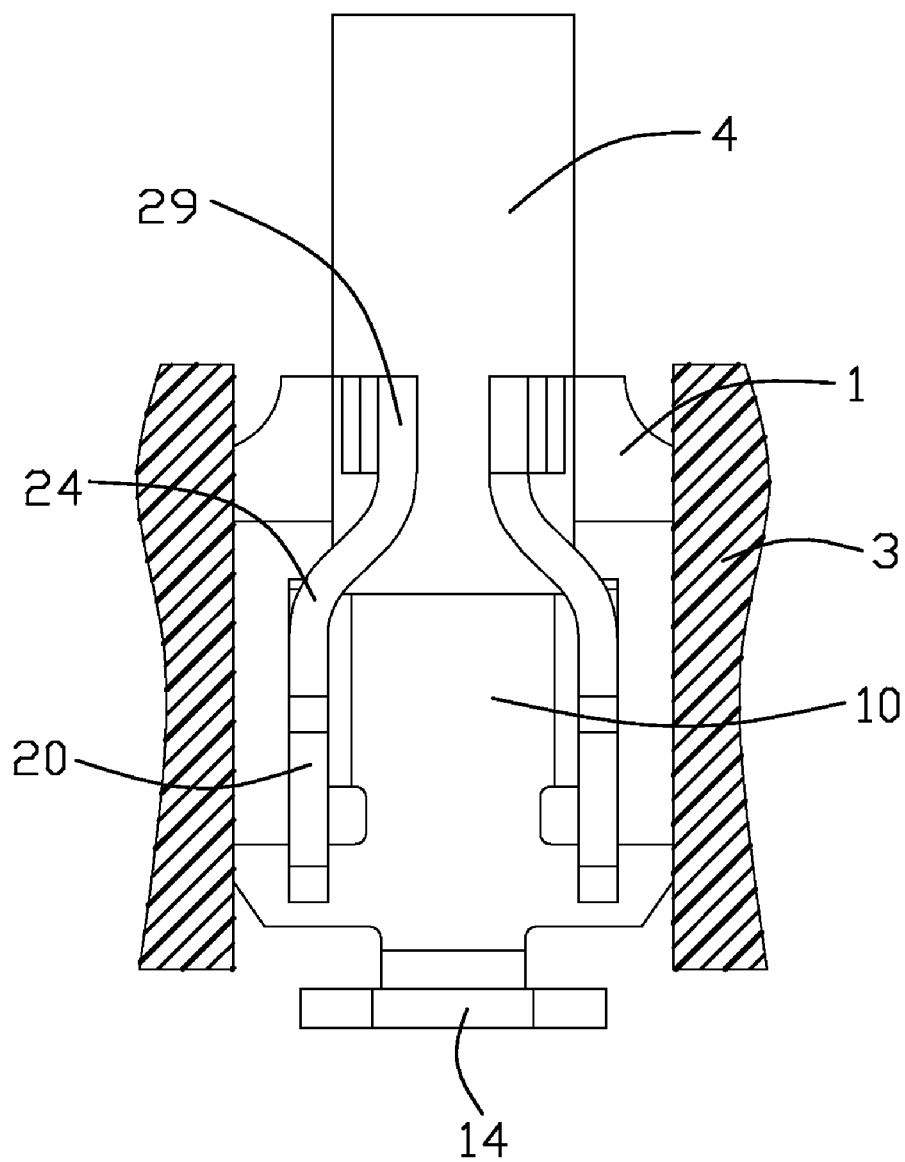
FIG. 2 is a cross-section view of the electrical connector when the pin leg is inserted into a second space defined by the contact.
Figure 3:
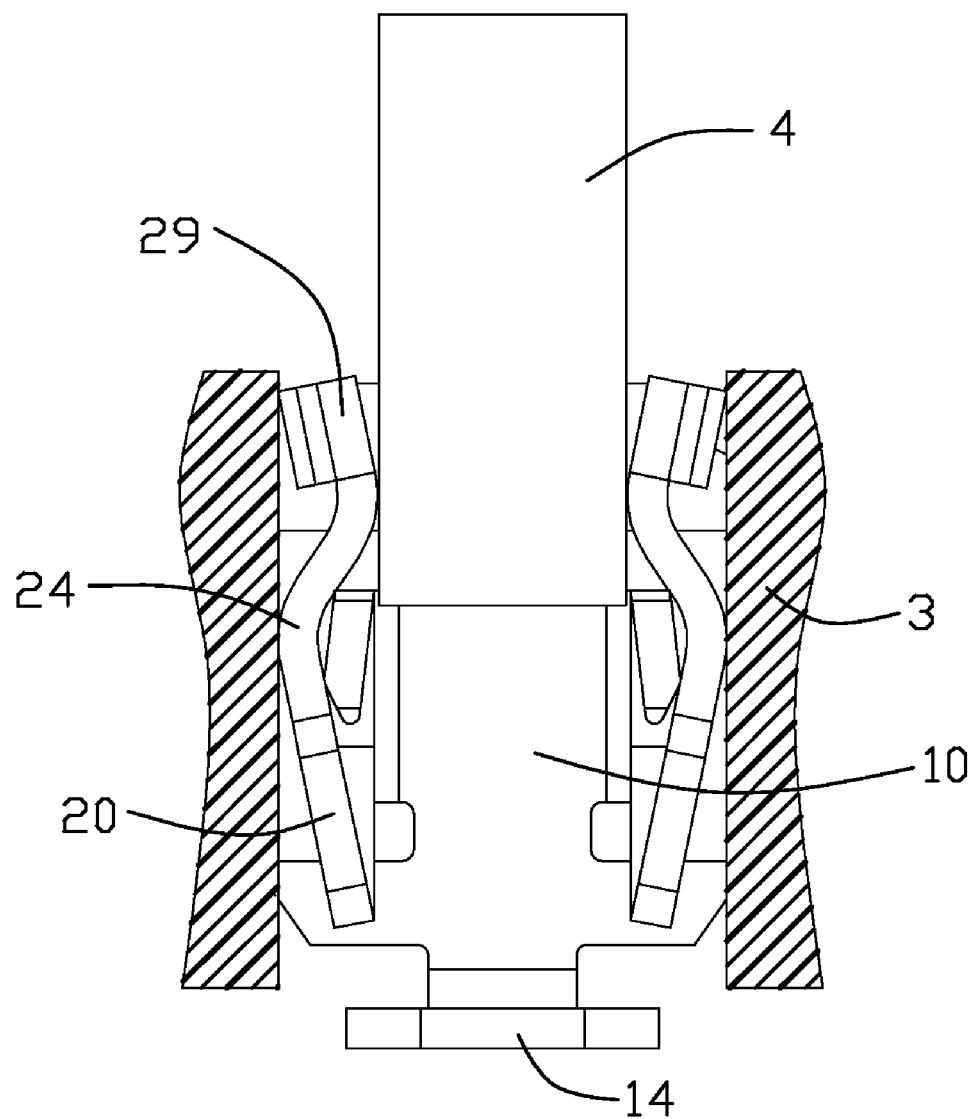
FIG. 3 is a cross-section view of the electrical connector when the pin leg is slid into a first space defined by the contact.

FIGS. 1-3 illustrate an electrical connector (not labeled) in accordance with the present invention, used for connecting a pin leg 4 of a central processing unit (CPU) (not shown) with a printed circuit board (PCB) (not shown) to transmit signals therebetween. The electrical connector comprises an insulative housing 3 and a metallic contact 1 inserted in the insulative housing 3.

Referring to FIG. 1, the metallic contact 1 comprises a base 10 and a pair of arm sections 20 connected to the base 10. The base 10 includes a body section 12, a head section 11 upwardly projecting from the body section 12, a bottom section 13 downwardly projecting from the body section 12 and a soldering section 14 extending perpendicularly from a bottom edge of the bottom section 13. A pair of upper projections 111 is respectively formed at the opposite lateral edges of the head section 11 and a pair of lower projections 131 is respectively formed at the opposite lateral edges of the bottom section 13, for interferingly securing the contact 1 in the insulative housing 3. Each arm section 20 includes an upper arm 21 extending obliquely and downwardly from one lateral edge of the body section 12 toward the soldering section 14, an elbow 23 at a bottom portion of the upper arm 21, a forearm 25 extending obliquely and upwardly from the elbow 23, a contact region 27 at a top portion of the forearm 25 and a palm 29 extending obliquely from the contact region 27 toward the body section 12. Each forearm 25 forms a heave 24 extending outwardly to act as a fulcrum when in use. The forearms 25 define a first space 251. A channel 271 is defined between the contact regions 27. A second space 291 is defined between the palms 29, in communication with the first space 251 at the channel 271. A portion of the first space 251 between the elbows 23 is wider than portions of the first space 251 between the forearms 25. A portion of the second space 291 between the palms 29 at the contact regions 27 is narrower than portions of the second space 291 between the palms 29 which are closer to the body section 12. The first space 251 and the second space 291 are respectively contained in first and second planes which are perpendicular to each other. In addition, a distance from the elbows 23 to the palms 29 is substantially equal to a distance from the soldering section 14 to the head section 11, thus an overall height of the contact 1 is compacted.

As is indicated in FIGS. 2-3, the pin leg 4 of the CPU is inserted to engage with the contact 1. The soldering section 14 of the contact 1 is adapted for being soldered onto the PCB by a soldering ball (not shown), for establishing an electrical connection between the pin leg 4 and an electrical trace of the PCB. Initially, the pin leg 4 is guided in the second space 291 by the palms 29, for subsequent engagement with the contact regions 27. The pin leg 4 is then slid from the second space 291 into the channel 271 and the first space 251. As a result, the arm sections 20 are outwardly deformed till the heave 24 interferes with the insulative housing 3 to provide a fulcrum. As clearly shown in FIG. 4, a distance from the heave 24 to the contact region 27 is smaller to provide a much larger force for ensuring the pin leg 4 of the CPU to be tightly clamped between the contact regions 27.

While a preferred embodiment in accordance with the present invention has been shown and described, equivalent modifications and changes known to persons skilled in the art according to the spirit of the present invention are considered within the scope of the present invention as described in the appended claims.

We claim:

1. An electrical connector for electrically connecting a pin leg of a CPU with a trace of a PCB, comprising:
   an insulative housing; and
   a contact comprising a base and a pair of arm sections oppositely extending from lateral sides of the base for engagement with the pin leg, the base having a body section for being secured in the insulative housing and a soldering section for being soldered onto the PCB, each arm section forming a heave to interfere with the insulative housing because of deformation of the arm sections, wherein each arm section comprises an upper arm extending obliquely and downwardly from one lateral edge of the body section toward the soldering section, an elbow at a bottom portion of the upper arm, a forearm extending obliquely and upwardly from the elbow, a contact region at a top portion of the forearm and a palm extending obliquely from the contact region toward the body section, wherein the heave is formed at each forearm, wherein the forearms define a first space therebetween and the palms define a second space therebetween, and the first space is in communication with the second space at a channel defined by the contact regions, wherein a portion of the first space between the elbows is wider than portions of the first space between the forearms, wherein a portion of the second space between the palms at the contact regions is narrower than portions of the second space between the palms which are closer to the body section, wherein the channel is narrower than both the first and second spaces, wherein the arm sections extend to a height substantially the same as a height of the base, wherein the base forms at least two projections on opposite lateral sides of the body section for securing the contact in the insulative housing, wherein the projections are formed above and below the body section.

* * * * *